(12) United States Patent
Gruhlke et al.

(10) Patent No.: US 7,474,680 B2
(45) Date of Patent: Jan. 6, 2009

(54) METHOD AND APPARATUS FOR MODIFYING THE SPREAD OF A LASER BEAM

(75) Inventors: Russell W. Gruhlke, Fort Collins, CO (US); William Richard Trutna, Jr., Atherton, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/686,228

(22) Filed: Mar. 14, 2007

(65) Prior Publication Data

US 2007/0153293 A1 Jul. 5, 2007

Related U.S. Application Data

(62) Division of application No. 10/366,755, filed on Feb. 13, 2003, now Pat. No. 7,418,016.

(51) Int. Cl.
*H01S 3/13* (2006.01)
*G09G 5/08* (2006.01)

(52) U.S. Cl. .................................. 372/29.014; 345/166

(58) Field of Classification Search ............ 372/29.014; 345/166
See application file for complete search history.

(56) References Cited

U.S. PATENT DOCUMENTS

| | | | |
|---|---|---|---|
| 4,402,574 A | 9/1983 | McConnel | |
| 4,521,772 A | 6/1985 | Lyon | |
| 4,645,302 A | 2/1987 | Aughton | |
| 4,794,384 A | 12/1988 | Jackson | |
| 5,016,149 A | 5/1991 | Tanaka et al. | |
| 5,719,702 A | 2/1998 | Decker | |
| 5,771,254 A * | 6/1998 | Baldwin et al. | 372/31 |
| 5,799,119 A | 8/1998 | Rolland | |
| 5,835,514 A | 11/1998 | Yuen et al. | |
| 6,007,218 A | 12/1999 | German et al. | |
| 6,064,786 A | 5/2000 | Cunningham | |
| 6,154,319 A | 11/2000 | Rando et al. | |
| 6,222,174 B1 | 4/2001 | Tullis et al. | |
| 6,236,520 B1 | 5/2001 | Weidel | |
| 6,256,016 B1 | 7/2001 | Piot | |
| 6,264,377 B1 | 7/2001 | Mitsuda | |
| 6,496,621 B1 | 12/2002 | Kathman et al. | |
| 6,530,697 B1 | 3/2003 | Johnson et al. | |

(Continued)

FOREIGN PATENT DOCUMENTS

DE 4335244 10/1993

(Continued)

OTHER PUBLICATIONS

"English translation of German Office Action No.", 10353381, (Feb. 22, 2005),8-51.

*Primary Examiner*—Minsun Harvey
*Assistant Examiner*—Phillip Nguyen

(57) ABSTRACT

An apparatus and method for modifying the spread of a laser beam. The apparatus comprises a laser source operable to generate a laser beam having a flux that exceeds a predetermined value and an optical train operable to modify the beam such that the flux of the beam through a predetermined aperture does not exceed the predetermined value. The optical train may include a focusing lens, a diffractive focusing vortex lens, a beam splitting device, or a two-dimensional diffraction grating.

6 Claims, 8 Drawing Sheets

U.S. PATENT DOCUMENTS

| | | |
|---|---|---|
| 6,617,577 B2 | 9/2003 | Krutchinsky et al. |
| 6,741,335 B2 | 5/2004 | Kinrot et al. |
| 6,784,441 B2 | 8/2004 | Ahlers |
| 6,801,354 B1 | 10/2004 | Payne et al. |
| 6,845,119 B2 | 1/2005 | Deckenbach |
| 6,856,460 B2 | 2/2005 | Coleman et al. |
| 2003/0123508 A1 | 7/2003 | Werner et al. |
| 2003/0141465 A1 | 7/2003 | Schuda |
| 2003/0142903 A1 | 7/2003 | Johnson et al. |
| 2004/0008414 A1 | 1/2004 | Coleman |
| 2004/0120717 A1 | 6/2004 | Clark et al. |
| 2004/0169929 A1* | 9/2004 | Sato et al. .................... 359/558 |
| 2004/0201893 A1 | 10/2004 | Coleman et al. |
| 2004/0201894 A1 | 10/2004 | Brown |

FOREIGN PATENT DOCUMENTS

| | | |
|---|---|---|
| EP | 964782 | 2/1998 |
| EP | 1170707 | 6/2001 |
| EP | 1279988 | 7/2002 |
| WO | WO-0013051 | 3/2000 |
| WO | WO-2004/006793 | 7/2002 |

* cited by examiner

METHOD AND APPARATUS FOR MODIFYING THE SPREAD OF A LASER BEAM

This is a divisional of application Ser. No. 10/366,755 filed on Feb. 13, 2003 now U.S. Pat. No. 7,418,016, the entire disclosure of which is incorporated into this application by reference.

BACKGROUND OF THE INVENTION

Many of today's devices use lasers to implement various functions. For example, an optical mouse or laser pointer use lasers in their respective operations. Additionally, many fiber-optic communication devices use a laser as a source of signal generation.

These lasers generate optical beams that can sometimes generate light powerful enough to damage the human eye. For example, a laser-optic pointing device typically includes a beam-altering apparatus in optical alignment with the laser designed to focus or collimate the laser beam for its intended use. Therefore, if a person looks into the laser beam, it may damage to the unaided eye and even if the laser beam is not powerful enough to cause damage, one may further focus the laser beam with a magnifying lens or other apparatus such that the further focused beam is capable of causing damage to the eye.

Because products containing laser devices are potentially hazardous to the eye, they are classified accordingly by their potential hazard level. One such classification scheme is the International Standards for The Safety of Laser Products (ISSLP). The least hazardous lasers, as classified by the ISSLP, are Class 1 laser devices. Lasers in this category are defined as being safe under reasonably foreseeable conditions of operation including the use of optical instruments such as a magnifying lens, for intra-beam viewing. The classification for the next least hazardous category of lasers and laser products is Class 1M. This class consists of lasers that are safe under reasonably foreseeable conditions of operation, but may be hazardous if the user employs an optical device for intra-beam viewing, i.e. a magnifying lens.

According to the ISSLP, the maximum-allowed power, i.e., acceptable emission light (AEL) level, for a commonly used single-mode 850 nm wavelength Class 1 laser is 0.78 milliwatts when measured according to the ISSLP-defined standard. The defined standard is the amount of flux (power per unit area) through a 7 millimeter (mm) aperture in a radial plane that is 14 mm from the point where the laser beam exits the device. Thus, if the flux of the laser beam that is passed through the 7 mm aperture hole is less than 0.78 milliwatts, then the laser is considered Class 1 safe.

A speckle-based motion sensor, which could be used in an optical mouse, is a device that uses a laser for its functionality. In a speckle-based motion sensor, a laser beam is directed to a surface and the reflection of the laser beam creates a complex diffraction pattern, called a speckle pattern. If the laser beam moves relative to the surface, then the speckle pattern changes. Detectors for receiving the reflected speckle pattern can then determine the relative changes in the speckle pattern and translate these changes to determine the relative lateral motion of the laser-beam source. For acceptable performance, however, a laser in a speckle-based motion sensor is typically operated at power levels that exceed the maximum-allowable AEL for a Class 1 rating. That is, if the power is reduced to the Class 1 requirements, the speckle-based motion sensor may not perform at an acceptable level.

SUMMARY OF THE INVENTION

An embodiment of the invention comprises a laser source operable to generate a laser beam having a flux that exceeds a predetermined value and an optical train operable to modify the beam such that the flux of the beam through a predetermined aperture does not exceed the predetermined value. The optical train may include a focusing lens, a diffractive focusing vortex lens, a beam splitting device, or a two-dimensional diffraction grating.

By diverging or diffracting some of the flux in the laser beam, a more powerful laser may be used in the apparatus, yet still comply with the ISSLP Class 1 rating. Such an apparatus and method may be used in devices that require a more powerful laser but still need to be within the Class 1 rating, such as an optical mouse.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
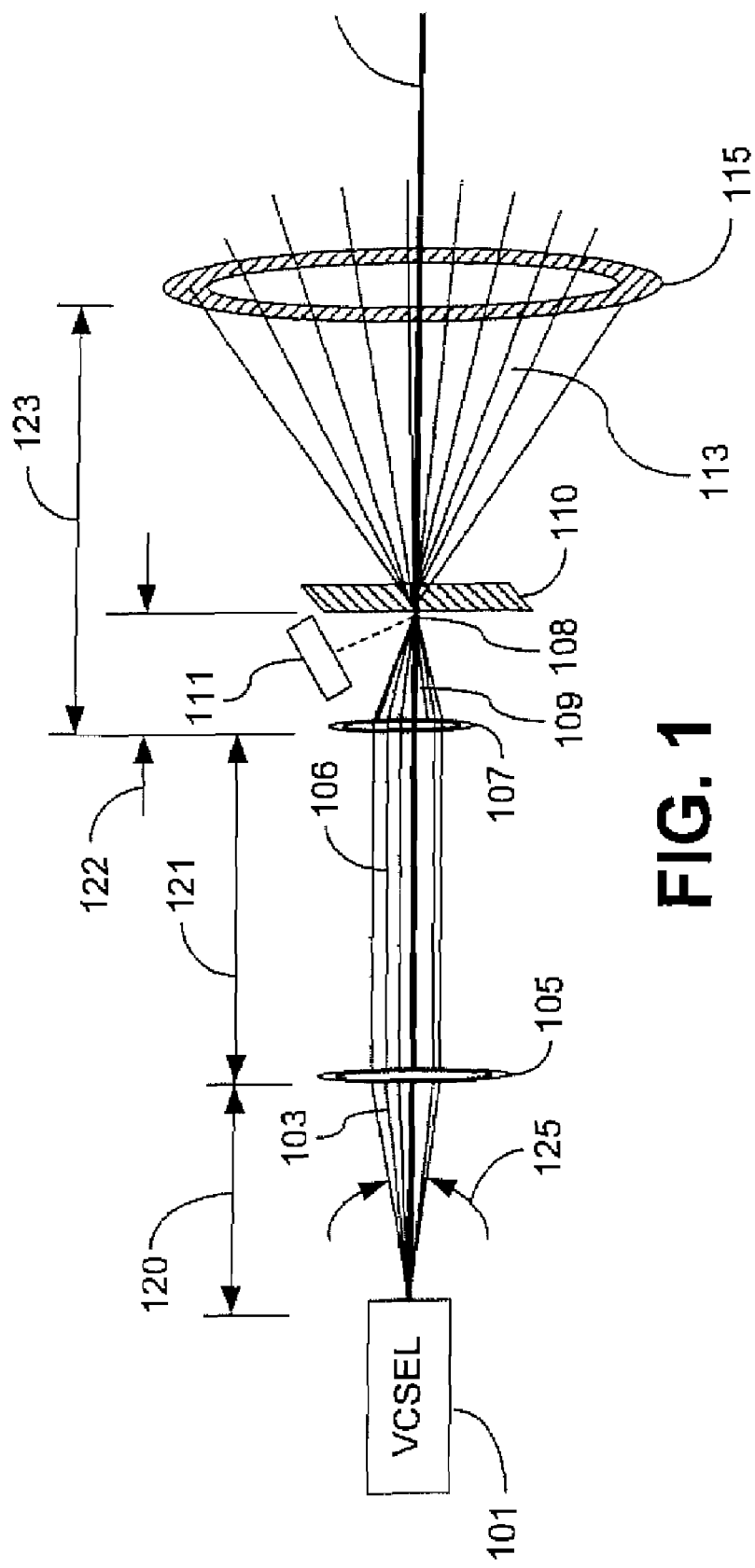
FIG. 1 is a diagram of a laser beam modifying apparatus that uses a focusing lens according to an embodiment of the invention.

FIG. 1 is a diagram of an apparatus for modifying a laser beam for use in an optical mouse according an embodiment of the invention. In this embodiment, a Vertical Cavity Surface Emitting Laser (VCSEL) 101 emits an 850 nm wavelength laser beam along an optical axis 102. A typical VCSEL 101 will have an associated divergence angle 125 which is a measure of the widest angle at which individual rays of the laser beam emanate from the VCSEL 101. Typically, the divergence angle 125 is defined as the angle at which the optical intensity (power per unit area) of the laser beam falls to one-half the peak, on-axis value. A typical laser beam may have a divergence angle 125 of up to about 20<. That is, individual rays of the laser beam emanate in a divergent, omni-directional manner at an angle of up to 10< from the optical axis 102. For the purposes of laser eye safety, however, a worst case scenario is taken into account where the divergence angle 125 is 12<.

The optical axis 102 of the VCSEL 101 is aligned with a collimating lens 105 located at a distance 120 of approximately 1.5 mm from the VCSEL 101. The collimating lens 105 refracts the diverging laser beam 103 to produce a collimated laser beam 106 that is aligned with the optical axis 102. Given a 12< divergence angle 125 before the diverging laser beam 103 enters the collimating lens 105, the diameter of the collimated laser beam 106 is 0.62 mm. Thus, without further conditioning, the entire collimated laser beam 106 would easily pass through the test aperture 115. The power emitted by the VCSEL 101 is, therefore, limited to the 0.78 mW AEL which may not produce an adequate signal level for use in the speckle-based motion sensor. Therefore, the collimated laser beam 106 is passed through another beam modifying medium 107, such as a lens, prism, or grating according to various embodiments of the invention as discussed below.

In the embodiment shown in FIG. 1, the beam modifying medium 107 is a refractive focusing lens 107. The collimated laser beam 106 is passed through the focusing lens 107 which is at a distance 121 of approximately 1 mm away from the collimating lens 105 along the optical axis 102. This 1 mm distance between the collimating lens 105 and the focusing lens 107 is typically equal to thickness of an optical substrate used to hold the lenses 105 and 107 in position. The focusing lens 107 focuses the collimated laser beam 106 to converge at a point 108 which is at a distance 122 of approximately 1 mm away from the focusing lens 107 along the optical axis 102. If the converging laser beam 109 were to strike an object, such as the target 110, the reflection would produce a speckle pattern that could be detected by a detection means 111. Since an optical mouse is typically placed on a mouse pad or other flat surface, the mouse pad or surface functions a suitable target 110 and the reflected speckle pattern may be detected by the detection means 111 within the optical mouse.

If the target 110 is removed, i.e., the optical mouse pointing device is lifted away from the reflecting surface, then the convergent laser beam 109 will traverse past the focal point 108 and then proceed to diverge. If one were to measure the flux of the now diverging laser beam 113 at a point at a distance 123 of approximately 14 mm from the focusing lens 107 (which is the closest point of human access as defined by the ISSPL for determining the AEL level for the laser eye-safety standard), one would find that only a portion of the diverging laser beam 113 would pass through the 7 mm aperture 115.

In the embodiment shown in FIG. 1, only about 25% of the diverging laser beam 113 will pass through the aperture 115. Even if the aperture 115 is moved to different angles with respect to the optical axis 102 (which is akin to looking at the focusing lens 107 from different angles), 25% of the divergent laser beam 113 will typically be the maximum amount to pass through the aperture 115. Thus, in this particular example, the AEL level of the VCSEL 101 could be as high as 3.0 milliwatts yet still only produce a flux of 0.75 milliwatts (which is below the Class 1 rating) through the 7 mm aperture 115.

Figure 2:
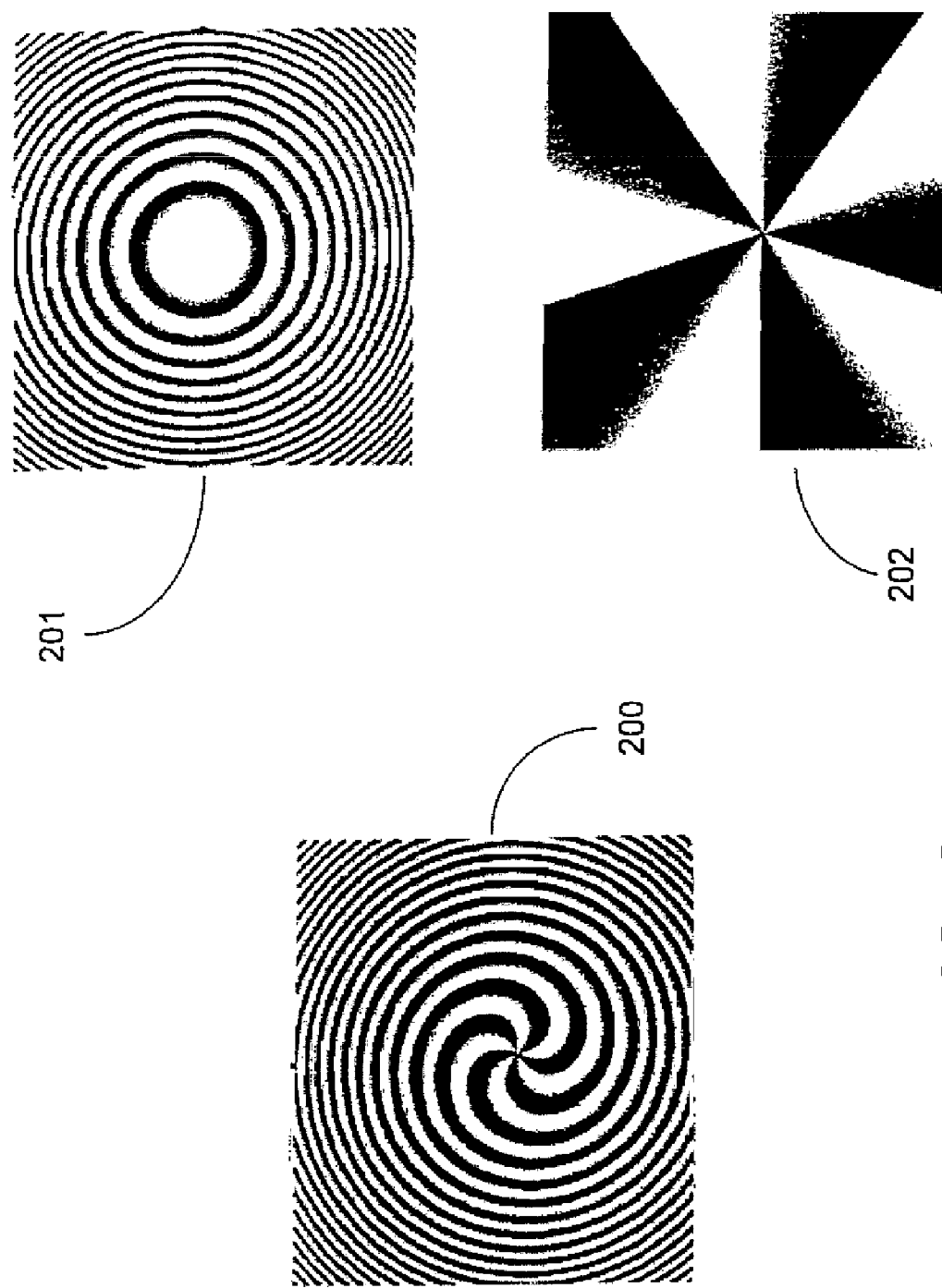
FIG. 2 is a top view of a diffractive focusing vortex lens or use in the apparatus of FIG. 1 according to an embodiment of the invention.

Other embodiments are contemplated wherein the modifying medium may be different. For example, instead of using a focusing lens 107, as is the case in the embodiment of FIG. 1, the modifying medium 107 may be a diffractive focusing vortex lens (not shown in FIG. 1). FIG. 2 shows a top view of a diffractive focusing vortex lens 200 according to an embodiment of the invention. There are several well-known ways of creating diffractive light using a diffractive focusing vortex lens 200. The diffractive focusing vortex lens 200 of FIG. 2 is created by superimposing a concentric edge microstructure lens 201 with a radial edge microstructure lens 202. The resulting effect to light, i.e., the collimated laser beam 106, passed through the superimposed lenses 201 and 202 causes light to "twist" away from diffractive focusing vortex lens 200 along the optical axis 102.

Figure 3:
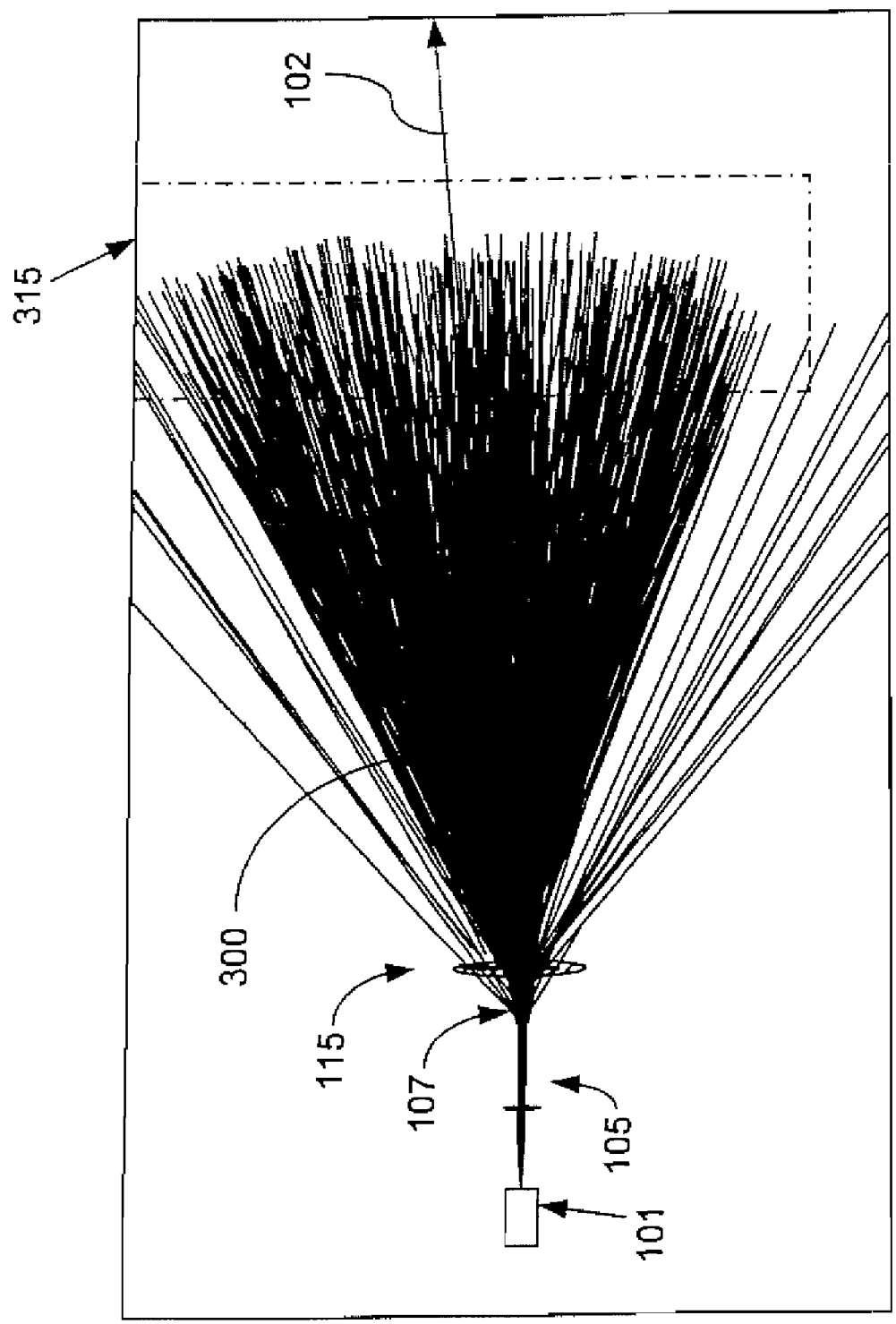
FIG. 3 is an orthogonal view of a ring shaped irradiance distribution pattern that results from modifying a laser beam with the diffractive focusing vortex lens of FIG. 2 according to an embodiment of the invention.

The twisting nature of light passed through the diffractive focusing vortex lens 200 results in the formation of a donut or ring-shaped irradiance distribution pattern 300 in the plane 315 orthogonal to the optical axis 102. This phenomenon, which appears as a "cone", is shown in FIG. 3. If designed properly, i.e., designed with the Class 1 rating in mind, the diameter of the "cone" of the ring-shaped irradiance distribution pattern 300 at the 14 mm point that corresponds to the aperture 115 position will be slightly larger than the aperture 115 diameter of 7 mm. Thus, if the aperture 115 is centered on the optical axis 102, little or no light passes through it.

Figure 4:
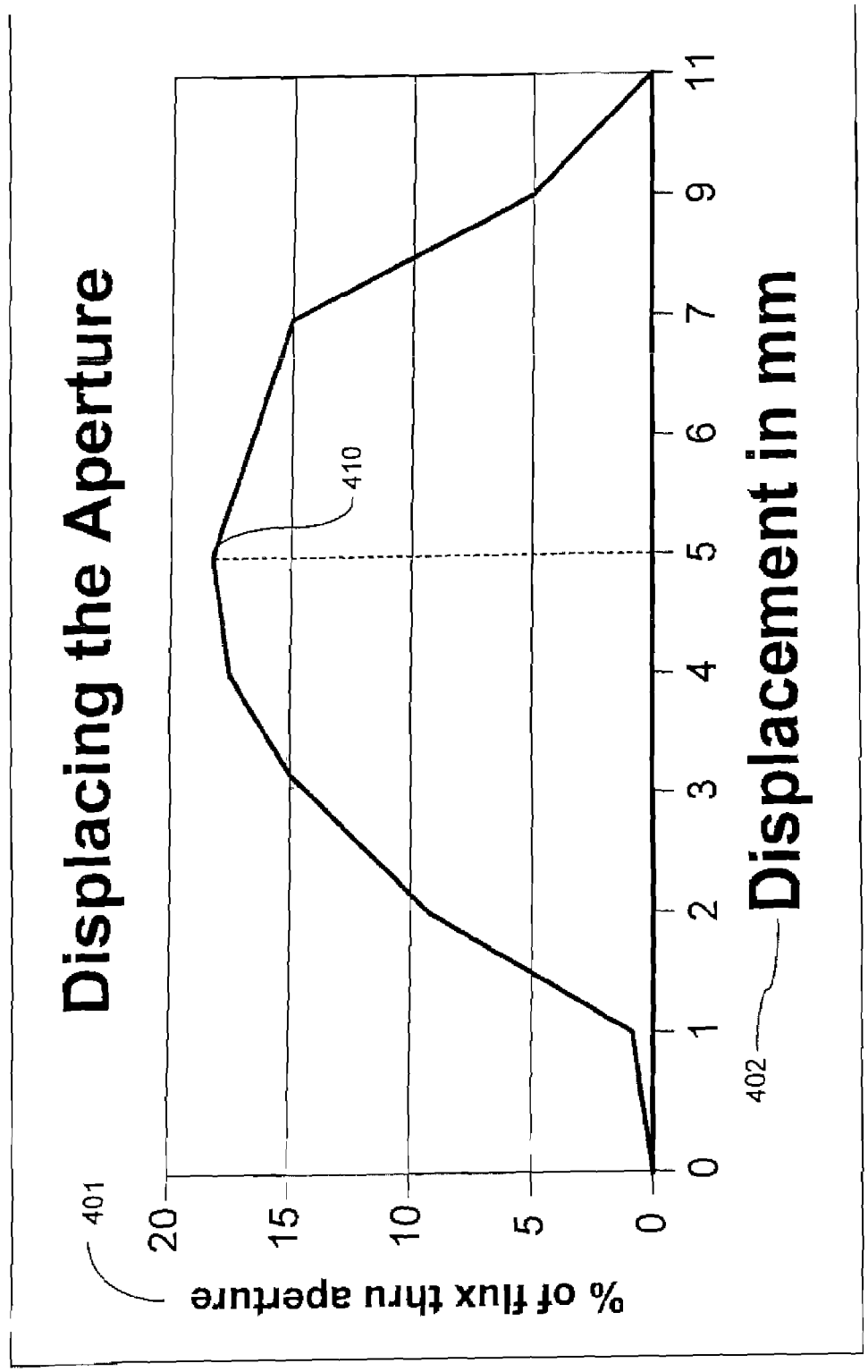
FIG. 4 is a graph of the percent of flux with respect to the displacement of the aperture that passes though the aperture when using the diffractive focusing vortex lens of FIG. 2 according to a embodiment of the invention.

A person, however, may not always choose to look directly into the optical axis 102. As such, portions of the ring-shaped irradiance distribution pattern 300 may enter the eye. Depending on the angle (measured as displacement from the optical axis 102) one is looking; the amount of flux will also vary. FIG. 4 shows a graph that plots the percent 401 of flux passing through the aperture 115 as a function of the displacement 402 in millimeters radial from the optical axis 102. A worst case scenario point 410 occurs when the aperture 115 is displaced 5 mm in a direction perpendicular to the optical axis 102. However, the maximum flux passing through the aperture at any given point is 20%. Thus, to be within the Class 1 rating, a VCSEL 101 may have an AEL level of up to 4 milliwatts.

Figure 5:
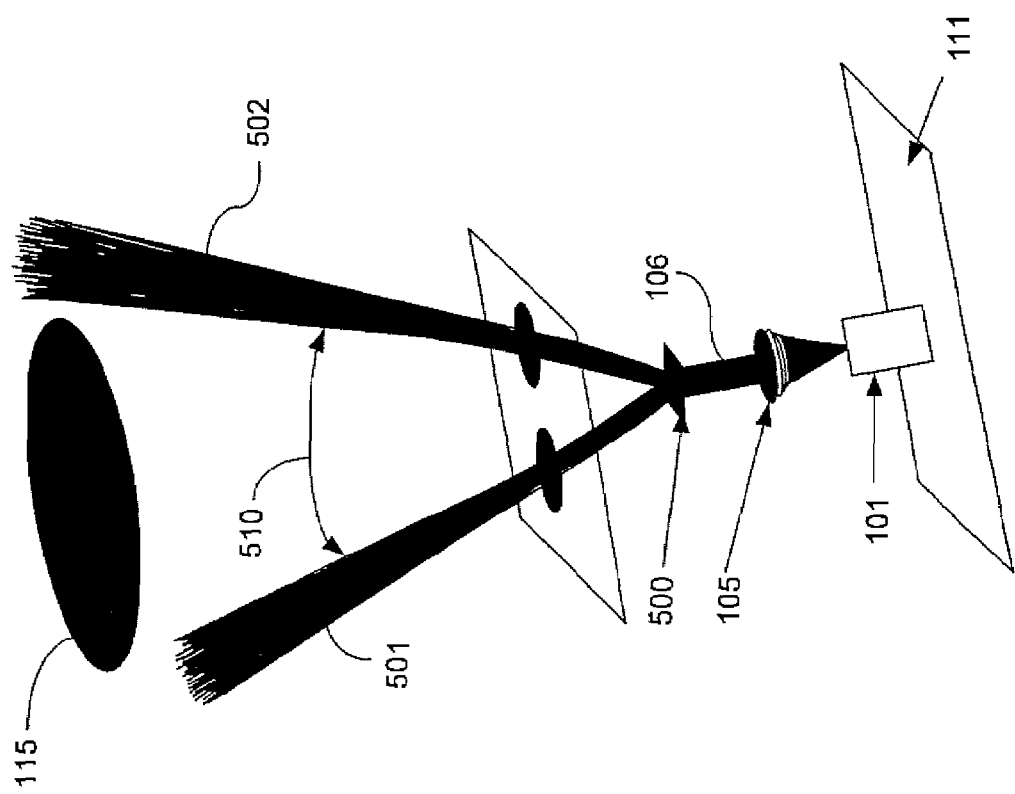
FIG. 5 is a diagram of a laser beam modifying apparatus that uses a beam splitting device according to an embodiment of the invention.

In another embodiment shown in FIG. 5, the modifying medium is a beam splitting element 500. The beam splitting element 500, which may include one or more prisms, is employed to reduce the amount of flux that passes through the 7 mm aperture 115 for any given viewing angle by refracting a portion of the laser beam in a different direction. When the collimated laser beam 106 enters the beam splitting element 500, the collimated laser beam 106 is split into a first set of collimated laser rays 501 and a second set of collimated laser rays 502. With an appropriate design in this embodiment, the two sets of collimated laser rays 501 and 502 diverge at an angle 510 large enough so that only one set of collimated laser rays 501 or 502 can pass through the 7 mm aperture 14 mm away at any given viewing angle. Thus, the minimum angle 510 between any two sets of collimated laser rays 501 and 502 is approximately 24.2 degrees. This effectively doubles the AEL level allowed for the VCSEL 101 to still be within the Class 1 rating.

The beam splitting element 500 may split the collimated laser beam 106 into more than two sets of collimated laser beams. If the collimated laser beam 106 is split into n separate collimated laser beams, the maximum allowable AEL level will be multiplied by n. In the example shown in FIG. 5, the AEL level is calculated to be equal to 2×0.78 milliwatts, or, 1.56 milliwatts maximum VCSEL power. Other possible beam splitting devices 500 include diffractive and holographic elements or multiple refractive lenses.

Figure 6A:
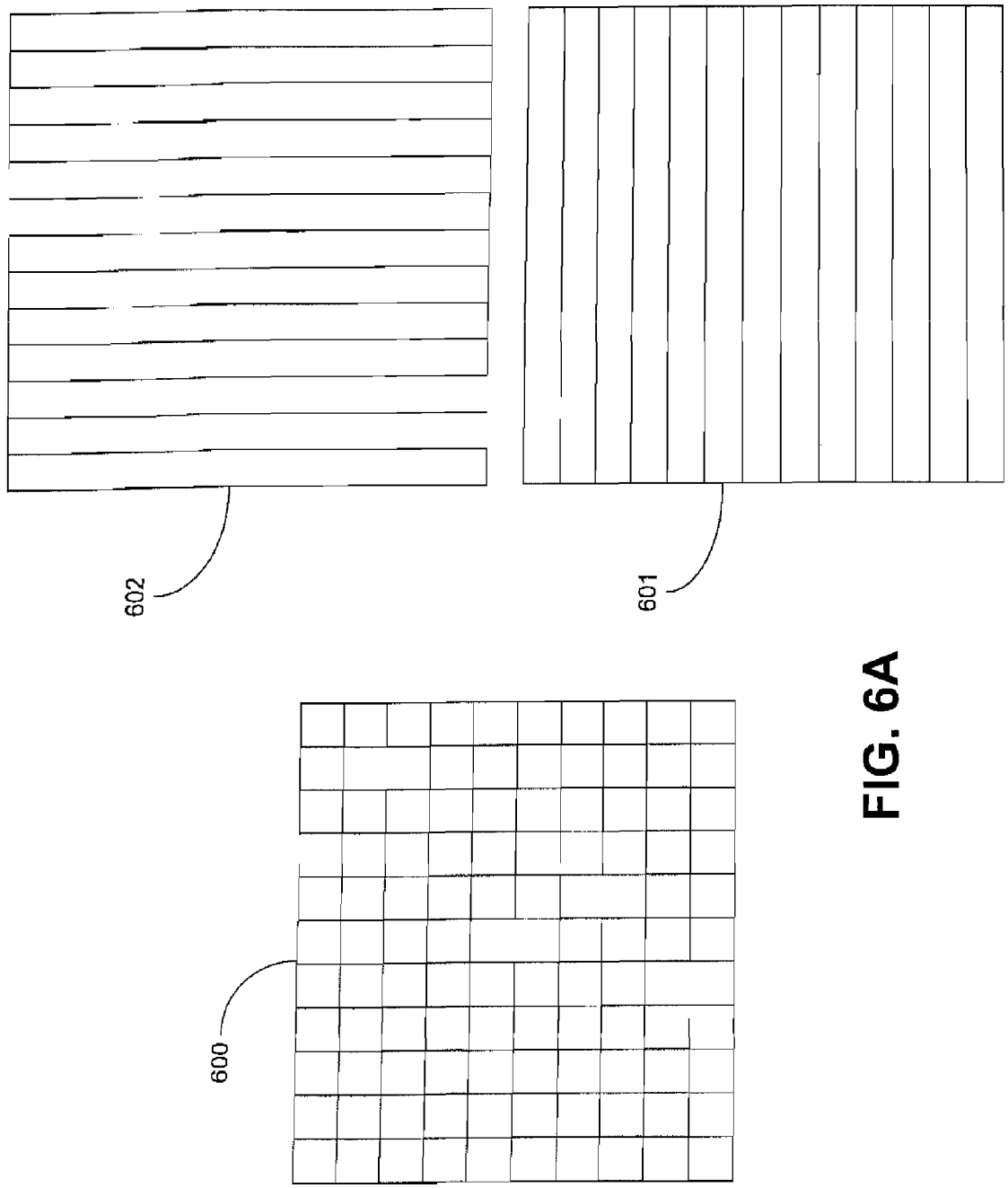
FIG. 6A is a top view of a two-dimensional diffractive grating for use in the apparatus of FIG. 1 according to an embodiment of the invention.

In yet another embodiment, the modifying medium may be a diffraction grating 600 as shown in FIG. 6A. The diffraction grating 600 is a two-dimensional diffraction element that includes a double exposure of its photo-resist layer coating on a glass substrate, an x-direction exposure 601 and a y-direction exposure 602. A well-known holographic exposure method in which two collimated UV laser beams impinge on the photo-resist surface at a known angle is used to create the two-dimensional diffraction grating 600. In this method, the interference of the two equal power collimated ultraviolet (UV) laser beams creates a sinusoidal intensity pattern whose period depends on the angle between the beams. The greater the angle, the smaller the period. The first exposure 601 creates a latent image of a sinusoidal phase grating along the x-direction. After rotating the substrate by 90 degrees, a second exposure 602 creates a grating along the y-direction. The final result is the two-dimensional diffraction grating 600 wherein the photo-resist layer pattern is a surface relief grating with a nearly sinusoidal groove shape in both x and y directions.

When the collimated laser beam 106 passes through such a two-dimensional diffraction grating 600, the collimated laser beam 106 is diffracted into an array of divergent laser beams 615 which emanate from the two-dimensional diffraction grating 600 at various angles. If the divergent laser beams 615 were to be displayed on a distant wall for viewing, an array of light spots 616 would be seen such as that shown in FIG. 6B. For the purposes of this discussion, the spots 616 are labeled in a simple x-y axis beginning with the spot from the undiffracted laser beam 620 at (0, 0). The spot from the first divergent laser beam 621 to the right is (1, 0), and so on. As the distance between the display wall and the laser source becomes larger, the distance between spots also becomes larger.

The angles between the divergent laser beams 615 are determined by the period of the two-dimensional diffraction grating 600. The angular separation is approximately/for the x-direction, where is the period of the x-grating 601 and is the laser wavelength. There is an identical expression for the diffraction angle for the y-grating 602.

Figure 6B:
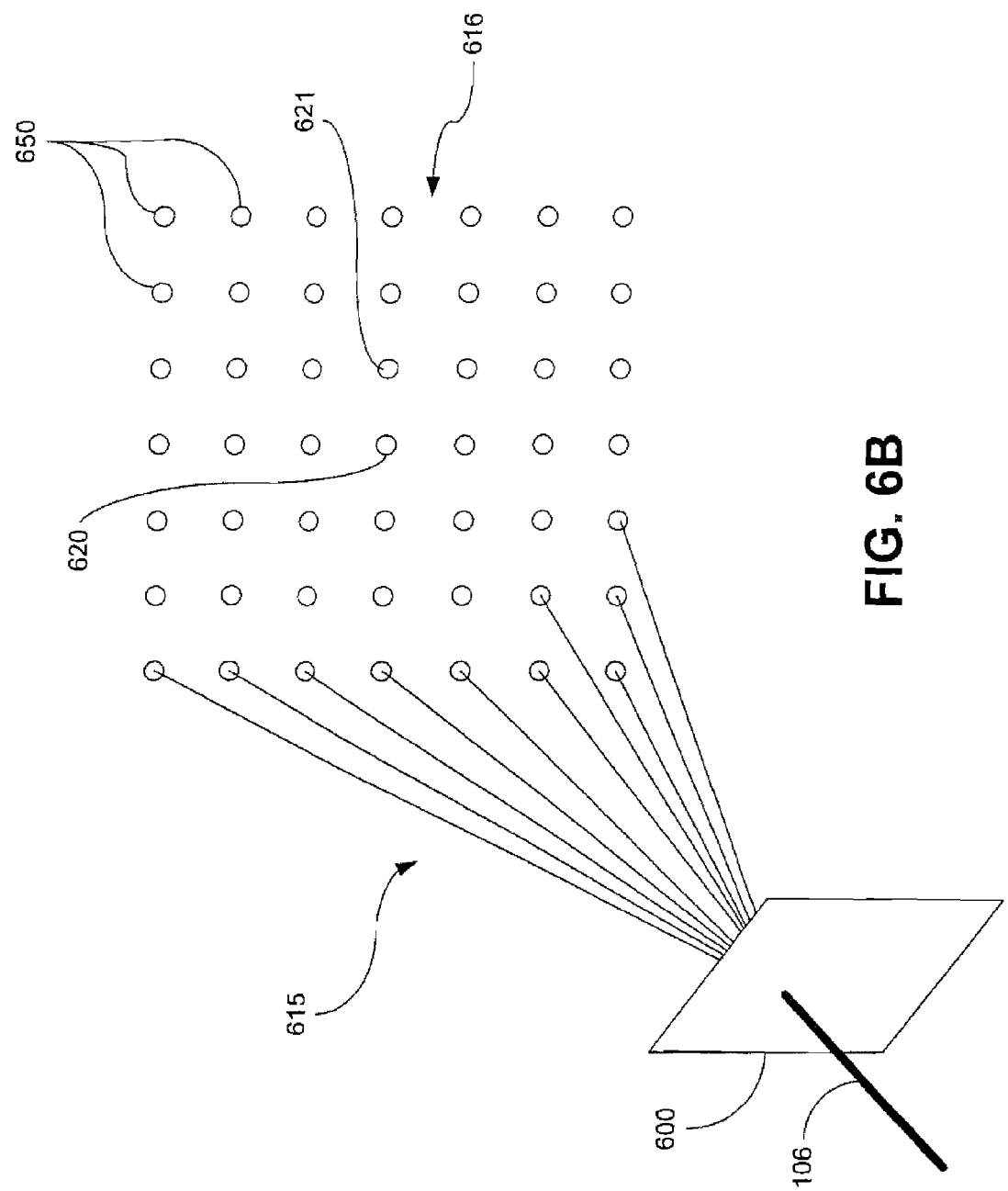
FIG. 6B is a plot of an array of divergent laser beams that result from a laser beam that passes through the two-dimensional diffractive grating of FIG. 6B according to an embodiment of the invention.

In one example, if is 15 microns and the wavelengths of the collimated laser beam 106 is 850 nm, then the angle between grating orders is about 56.7 milliradians or about 3.25 degrees. FIG. 6B shows a diffraction pattern for equal x-grating 601 and y-grating 602 periods. The flux in the higher orders 650 decreases gradually with grating order and the higher orders 650 extend to nearly 90 degrees off of the two-dimensional diffraction grating 600 normal. The fractional power diffracted into the (p,q) order can be shown (*Introduction to Fourier Optics*, J. W. Goodman, McGraw Hill, 1968) to be:

where J is the Bessel function of the first kind, order p or q and m is the peak-to-peak phase delay of the two-dimensional diffraction grating 600, which is proportional to groove depth. In this embodiment, the x-grating 601 and the y grating 602 groove depths are the same, but in other embodiments, they may be different. If m=8 radians, then the maximum flux in the zero order laser beam (the undiffracted laser beam 620) is about 2.5% of the flux of the collimated laser beam 106. The flux in orders (0,1), (1,0), (0,−1), and (−1,0) 621 is about 0.07% of the flux of the collimated laser beam 106. In orders (1,1), (1,−1), (−1,1), and (−1,−1) the flux is about 0.0019% of the flux of the collimated laser beam 106. The deep grooves spread the flux into many higher order 650 laser beams. If the two-dimensional diffraction grating 600 is made shallower, i.e., reducing m, then the flux in the lower orders will rise. For example, reducing m to 2 increases the flux in the zero order laser beam 620 to 34% of the collimated laser beam 106 beam.

An advantage of using a two-dimensional diffraction grating 600 as the modifying medium in the system of FIG. 1 is that by designing the spatial frequency, wherein the angle between diverging laser beams 615 is high enough, typically only one of the diffraction orders can pass through the 7 mm aperture 115. Therefore, for a 7 mm aperture 115 which is 14 mm away from two-dimensional diffraction grating 600, the angle between divergent laser beams 615 is typically greater than about 24.2 degrees. Even if the angle between the divergent laser beams 615 is less than 24.2 degrees, so that multiple divergent laser beams 615 may enter the 7 mm aperture 115, the divergent laser beams 615 will still not cause damage to the human eye. The reason for this is that the divergent laser beams 615 will not focus to a single spot on the retina, but rather an array of spots 616. Since eye damage is typically caused by localized heating of the retina, spreading the light into an array of spots 616 reduces the possibility of damage to the eye, thus increases the maximum allowable AEL level for a VCSEL 101.

Because only one divergent laser beam 615 will pass through the aperture 115 at any one angle of incidence, only the strongest divergent laser beam 615 (the undiffracted laser beam 620 (0,0)) needs to be taken into consideration for the eye-safety standard since all other divergent laser beams 615 have a lower magnitude. As such, for a grating modulation of m=8, the flux of the undiffracted laser beam 620 is about 2.5% of the flux of the collimated laser beam 106 as discussed above. Therefore, an acceptable AEL level for a VCSEL 101 in this embodiment may be 40 times the Class 1 rating. Even if m=2, the AEL level for a VCSEL 101 may be about 3 times the Class 1 rating.

Figure 7:
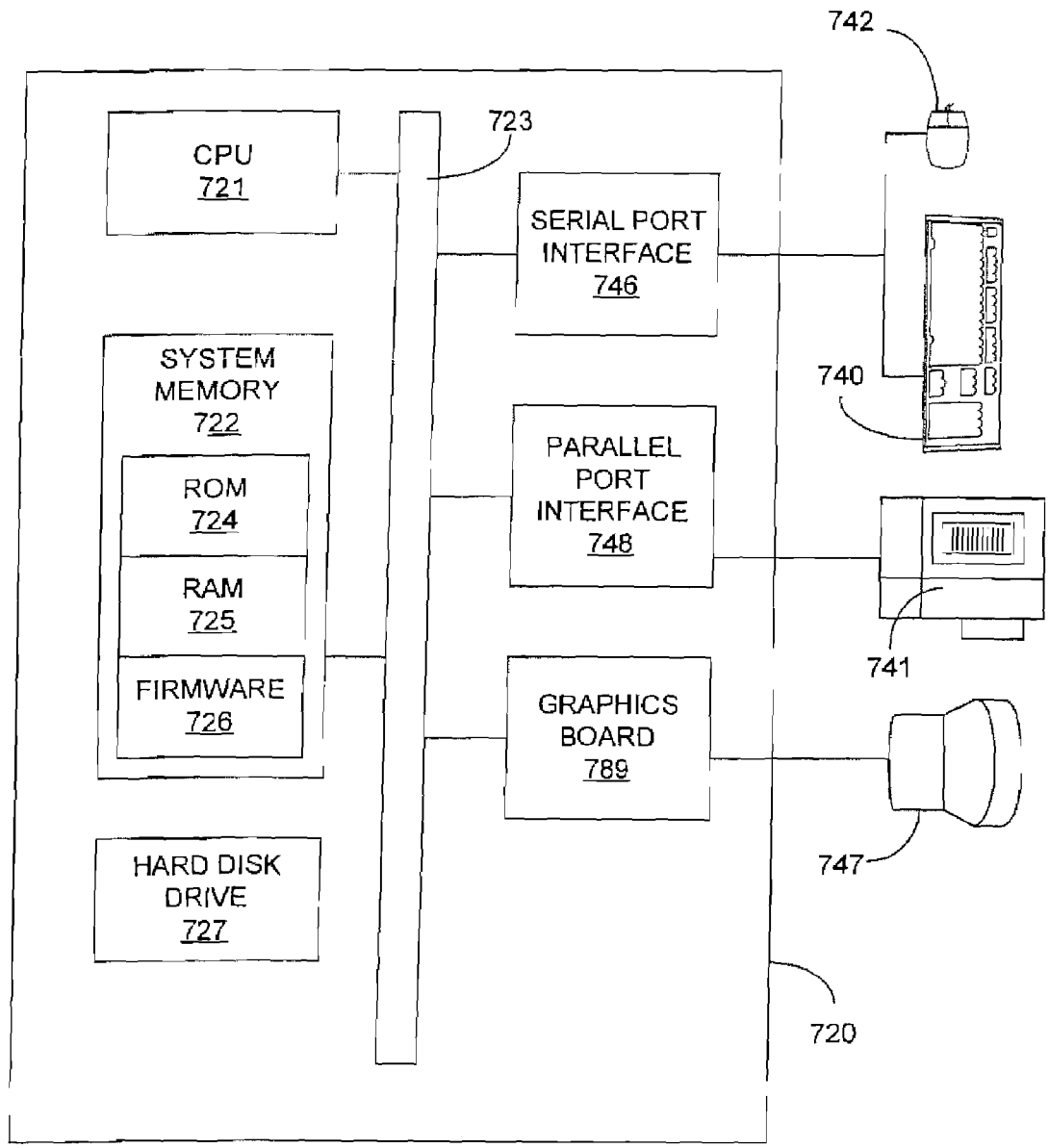
FIG. 7 is a block diagram of a general-purpose computer system that includes an optical mouse that incorporates the apparatus of FIG. 1 according to an embodiment of the invention.

FIG. 7 is a block diagram of a general-purpose computer system 720 that includes an optical mouse 742 that incorporates the apparatus of FIG. 1 according to an embodiment of the invention. The computer system 720 (e.g., personal or server) includes one or more processing units 721, system memory 722, and a system bus 723. The system bus 723 couples the various system components including the system memory 722 to the processing unit 721. The system bus 723 may be any of several types of busses including a memory bus, a peripheral bus, and a local bus using any of a variety of bus architectures. The system memory 722 typically includes read-only memory (ROM) 724 and random-access memory (RAM) 725. Firmware 726 containing the basic routines that help to transfer information between elements within the computer system 720 is also contained within the system memory 722. The computer system 720 may further include a hard disk-drive system 727 that is also connected to the system bus 723. Additionally, optical drives (not shown), CD-ROM drives (not shown), floppy drives (not shown) may be connected to the system bus 723 through respective drive controllers (not shown) as well.

A user may enter commands and information into the computer system 720 through input devices such as a keyboard 740 and an optical mouse 742. These input devices as well as others not shown are typically connected to the system bus 723 through a serial port interface 746. Other interfaces (not shown) include Universal Serial Bus (USB) and parallel ports 740. A monitor 747 or other type of display device may also be connected to the system bus 723 via an interface such as the graphics card 789.

We claim:

1. An apparatus, comprising:
a laser source operable to generate a laser beam having a flux that exceeds 0.78 milliwatts when measured according to an ISSLP-defined standard;
an optical train operable to modify the beam such that the flux of the beam through an approximately 7 mm aperture in a radial plane approximately 14 mm from a point where the beam exits the apparatus does not exceed 0.78 milliwatts when measured according to an ISSLP-defined standard;
wherein the optical train comprises a beam splitting element operable to split the laser beam into two or more sets of beams having an angle between any two sets of beams.

2. The apparatus of claim 1 wherein the beam splitting element comprises one or more prisms.

3. The apparatus of claim 1 wherein a minimum angle between any two sets of rays is approximately 24.2 degrees.

4. An apparatus, comprising:
a laser source operable to generate a laser beam having a flux that exceeds 0.78 milliwatts when measured according to an ISSLP-defined standard;
an optical train operable to modify the beam such that the flux of the beam through an approximately 7 mm aperture in a radial plane approximately 14 mm from a point where the beam exits the apparatus does not exceed 0.78 milliwatts when measured according to an ISSLP-defined standard;
wherein the optical train comprises a diffraction grating operable to diffract the laser beam into two or more sets of beams having a non-zero angle between any two sets of beams.

5. The apparatus of claim 4 wherein a minimum angle between any two sets of rays is approximately 12.1 degrees.

6. The apparatus of claim 4 wherein the diffraction grating is a two-dimensional diffraction grating.

* * * * *